(12) United States Patent
Shultz

(10) Patent No.: US 8,002,164 B2
(45) Date of Patent: Aug. 23, 2011

(54) STEP-DOWN TRANSITION OF A SOLDER HEAD IN THE INJECTION MOLDING SOLDERING PROCESS

(75) Inventor: Mark D. Shultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/814,746

(22) Filed: Jun. 14, 2010

(65) Prior Publication Data

US 2010/0252225 A1   Oct. 7, 2010

Related U.S. Application Data

(62) Division of application No. 11/508,082, filed on Aug. 22, 2006, now Pat. No. 7,757,932.

(51) Int. Cl.
   *B23K 3/06*     (2006.01)
   *B23K 31/02*    (2006.01)

(52) U.S. Cl. .............................. 228/33; 228/43; 228/256

(58) Field of Classification Search .................... 228/33, 228/43, 256
See application file for complete search history.

(56) References Cited

U.S. PATENT DOCUMENTS

| | | | | |
|---|---|---|---|---|
| 6,231,333 B1 * | 5/2001 | Gruber et al. | ................. | 425/546 |
| 6,814,918 B2 * | 11/2004 | Pedigo | ......................... | 264/443 |
| 7,607,527 B2 * | 10/2009 | Yazaki et al. | ............... | 193/35 R |
| 2006/0191590 A1 * | 8/2006 | Wegman | ......................... | 141/65 |
| 2007/0263026 A1 * | 11/2007 | Shang et al. | ................... | 347/22 |

FOREIGN PATENT DOCUMENTS

WO   WO 2005070792 A1 *   8/2005

* cited by examiner

*Primary Examiner* — Jessica L Ward
*Assistant Examiner* — Jacky Yuen
(74) *Attorney, Agent, or Firm* — Michael J. Buchenhorner; Vazken Alexanian

(57) ABSTRACT

A mold plate to parking location interface includes: a mold plate for holding solder; a fill head with an o-ring for dispensing solder bumps on the mold plate; a parking location for locating the fill head; and a platform between the mold plate and the parking location for relatively moving the fill head from the first location to the second location such that the o-ring decompresses as it passes over the platform.

7 Claims, 6 Drawing Sheets

STEP-DOWN TRANSITION OF A SOLDER HEAD IN THE INJECTION MOLDING SOLDERING PROCESS

CROSS-REFERENCE TO RELATED APPLICATIONS

This application is a division of, and claims priority from, co-pending and commonly-owned U.S. patent application Ser. No. 11/508,082, filed on Aug. 22, 2006.

STATEMENT REGARDING FEDERALLY SPONSORED-RESEARCH OR DEVELOPMENT

Not applicable.

INCORPORATION BY REFERENCE OF MATERIAL SUBMITTED ON A COMPACT DISC

Not Applicable.

FIELD OF THE INVENTION

The invention disclosed broadly relates to the field of semiconductor packaging technology and more particularly relates to the process of creating solder bumps for integrated circuit wafers.

BACKGROUND OF THE INVENTION

The face-down soldering of integrated circuit (IC) devices to chip carriers, known as "flip-chip packaging" has been used in the semiconductor manufacturing process for forty years. Injection Molding Soldering (IMS) is a technique developed by IBM to address the cost vs. quality issues associated with current wafer bumping technologies. IMS as applied to wafer bumping has been dubbed C4NP (Controlled Collapse Chip Connection New Process) and is the newest semiconductor packaging technology developed by IBM for putting C4 solder bumps onto chips at the wafer level using a lead-free solder.

C4NP involves filling specially designed pits in a solder mold (mold plate) using a head which provides molten solder. The solder is typically constrained to the head and operating area by an o-ring that is compressed between the fill head and the mold plate. This interface between the fill head and the mold plate must be moved onto the mold plate from a parking location of some sort, as the head must remain at operating temperature (with the solder molten). This is done by moving the head across a seam between the mold plate and the parking area, stressing and often damaging the o-ring. This limits the machine throughput, as o-ring replacement is a lengthy process. In addition, o-rings are stressed and damaged by reversals in motion and direction, so any solution would be best if it was implemented in a unidirectional way. It would also be beneficial if in any solution for the interface cleaning process could be accomplished without machine downtime.

SUMMARY OF THE INVENTION

Briefly, according to an embodiment of the invention, a method for dispensing solder bumps on a mold plate includes the steps of: relatively moving a fill head comprising an o-ring from a first location to a second location such that the o-ring decompresses as it crosses from the first location to the second location; filling at least one cavity in the mold plate with solder; and then relatively moving the fill head from the second location to a third location such that the o-ring decompresses as it crosses from the second location to the third location. The step of relatively moving the fill head from the first location to the second location includes moving from a higher elevation to a lower elevation.

DETAILED DESCRIPTION

Figure 1:
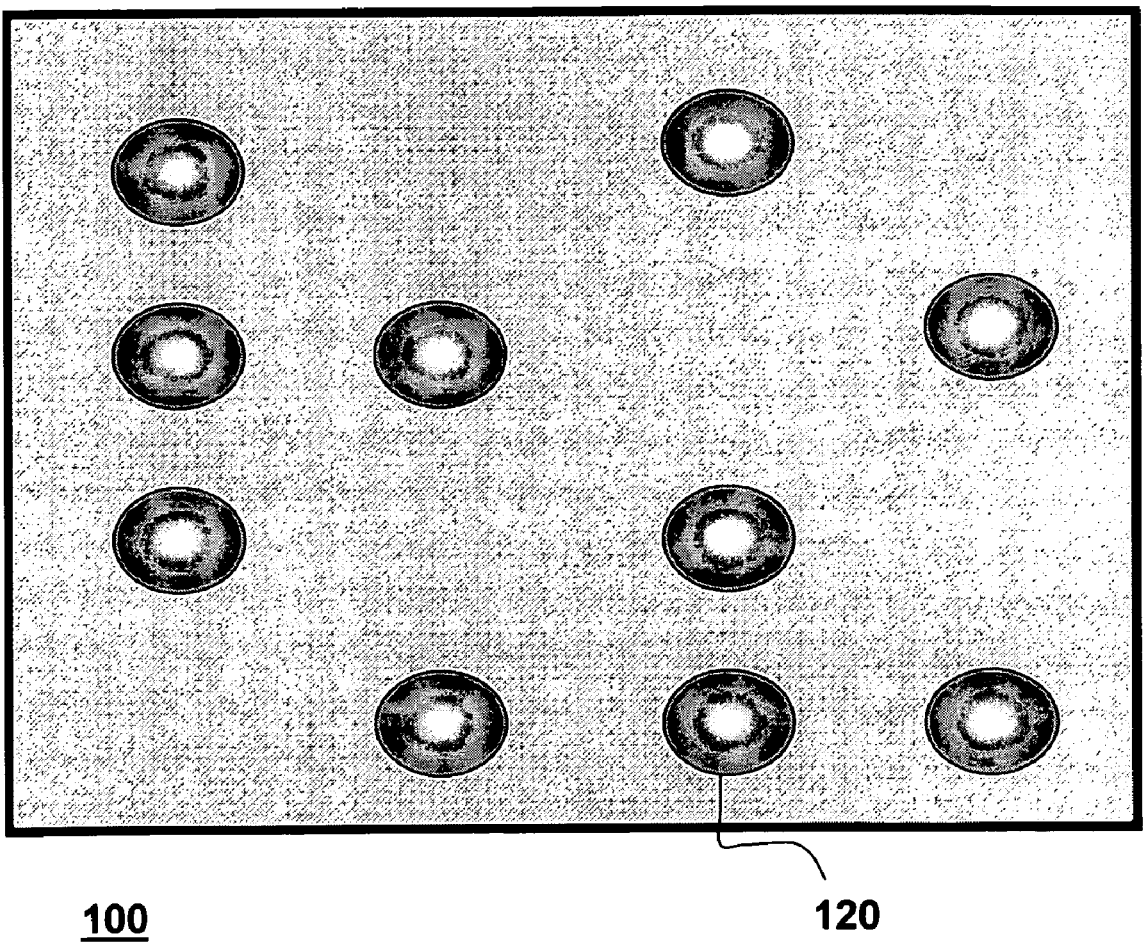
FIG. 1 is an illustration of a mold plate showing unfilled cavities, according to the known art.

Referring to FIG. 1, there is shown a top-level view of a mold plate 100 used in solder wafer bumping, also known as "C4 wafer bumping." The multiple etched cavities 120 on the mold plate match the pattern of solder bumps (the "bond pads") required on the wafer. The cavity size and spacing determine the solder bump volume and pitch. The cavities 120 give precise control of bump solder volume, resulting in excellent bump height uniformity. Typical applications might call for 75-μm diameter bumps on 150-μm pitch. Smaller bumps down to 25-μm in diameter on 50-μm pitch have been demonstrated, matching the fine-pitch capability of electroplated bumps. For a higher board-to-die standoff, jumbo BGA solder bumps could be molded to 500-μm diameter.

The mold plate 100 is typically constructed of borosilicate glass. In selecting a material for the mold plate 100 the Coefficient of Thermal Expansion (CTE) must be taken into consideration. For example, the thermal expansion of the glass mold matches the thermal expansion of the silicon wafer. Other materials may be used, provided the CTE is taken into consideration.

Figure 2:
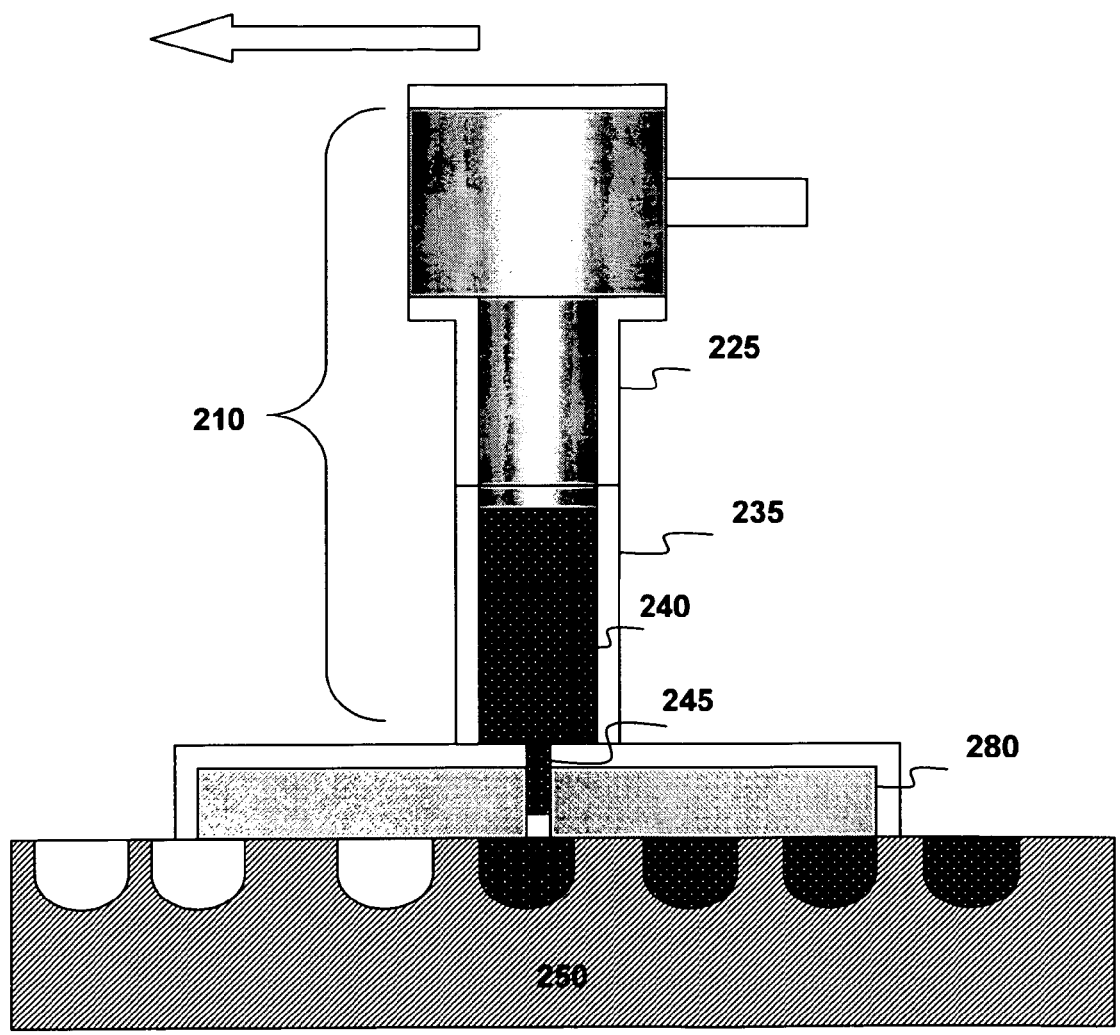
FIG. 2 is a schematic side view of a basic IMS head for dispensing molten solder onto a mold plate, according to the known art.

Referring to FIG. 2, we show a basic IMS filling head 200 for dispensing molten solder onto a mold plate. The dispenser 210 contains a movable plunger 225 for exerting pressure on the molten solder 240. A reservoir 235 for the containment of the molten solder 240 is disposed at the end of the dispenser 210. The temperature of the reservoir 235 is typically maintained at 10° to 20° Celsius above the solder melting point. To inject solder into a cavity, pressure is exerted on the plunger 225 so that it descends into the reservoir 235, thus forcing the molten solder through an aperture 245 and into a cavity in the mold plate 250. In this figure the head is shown moving right to left. The filled cavities are shown as black while the unfilled cavities are shown as white.

Figure 3:
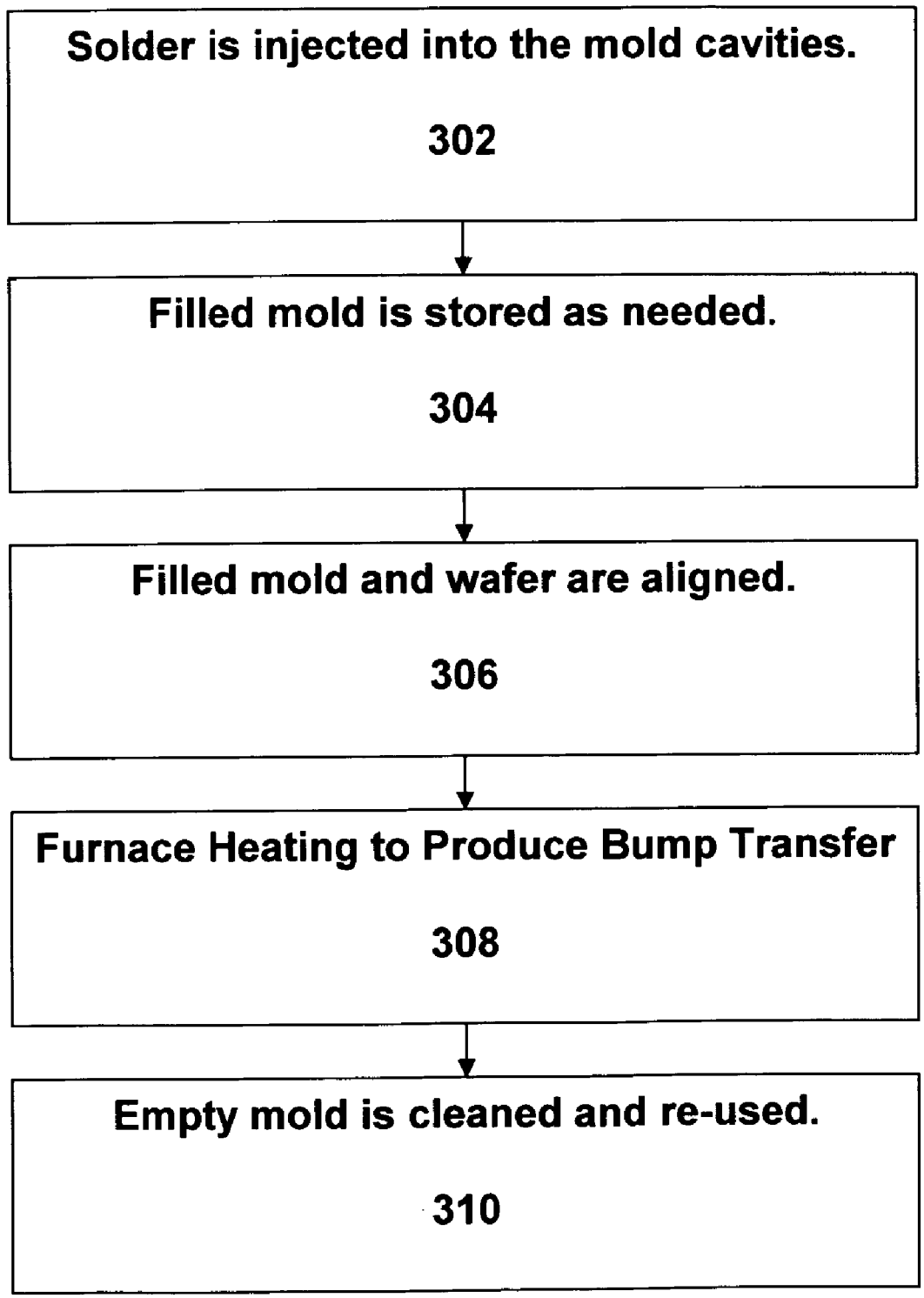
FIG. 3 is a flow chart of the bumping process of IMS, according to the known art.

An o-ring 280 acts as a seal to prevent solder leakage. The o-ring 280 also provides solder containment and solidification zone definition. When the o-ring 280 moves across the mold plate 250 it acts as a wiper to remove excess solder over the surface of the plate without disturbing the solder in the cavities. This eliminates the need to incorporate a separate wiper into the fill head mechanism. The o-ring 280 is preferably a concentric conformable material such as rubber which does not adhere to the mold plate 250. The contact patch (compressed area) of the o-ring 280 provides somewhat of a solidification zone. The process of solder bumping using the IMS technique is detailed in the flowchart of FIG. 3. In step 302 the molten solder is injected into the mold plate cavities 120 through the dispenser 210. The mold plate 100 is heated to just below the melting point of the solder. The injector includes a slightly pressurized reservoir of molten solder of any composition. The filling head 200 automatically fills all cavities in the mold 100, maintaining close contact with the mold plate. The cavities are uniformly filled with the molten solder to the level of the mold plate surface.

In step 304 the filled mold can be cooled and then stored indefinitely at room temperature in dry nitrogen until it is needed. When the process continues to the next step in 306 the filled mold and the wafer are aligned so that the mold cavities 120 exactly match the points on the wafer where the solder is needed. Then in step 308 the mold and the wafer are heated in a furnace with the mold disposed over the wafer so that the solder bumps adhere to the surface of the wafer. After adhesion of the solder bumps in step 310 the empty mold is cleaned in a simple wet-chemistry process and re-used.

In creating the solder bumps, often the fill head is secured to a moving arm which moves over and above a mold plate carrier (a belt or platform) where the mold plates are positioned and ready for filling. The fill head moves in one direction. Alternatively, the fill head remains stationary and it is the mold plate carrier which moves in one direction. The fill head remains stationary but it is considered to exhibit "relative" movement, rather than actual movement, with respect to the mold plate carrier. Although both movement methods can be implemented in this embodiment, for simplicity we will assume the mold plate 250 moves relative to a fixed fill head.

When the fill head has moved over the mold plate and filled all of the cavities, it next moves onto a parking, or transitional platform, before moving on to the next mold. The o-ring on the fill head is making contact with the mold plate and parking platform as it moves over them. As the o-ring moves over the seam where the mold plate abuts the parking plate it is stressed. Repeated stressing of the o-ring degrades the o-ring, necessitating replacement. This causes expensive downtime of the machinery.

Figure 4A:
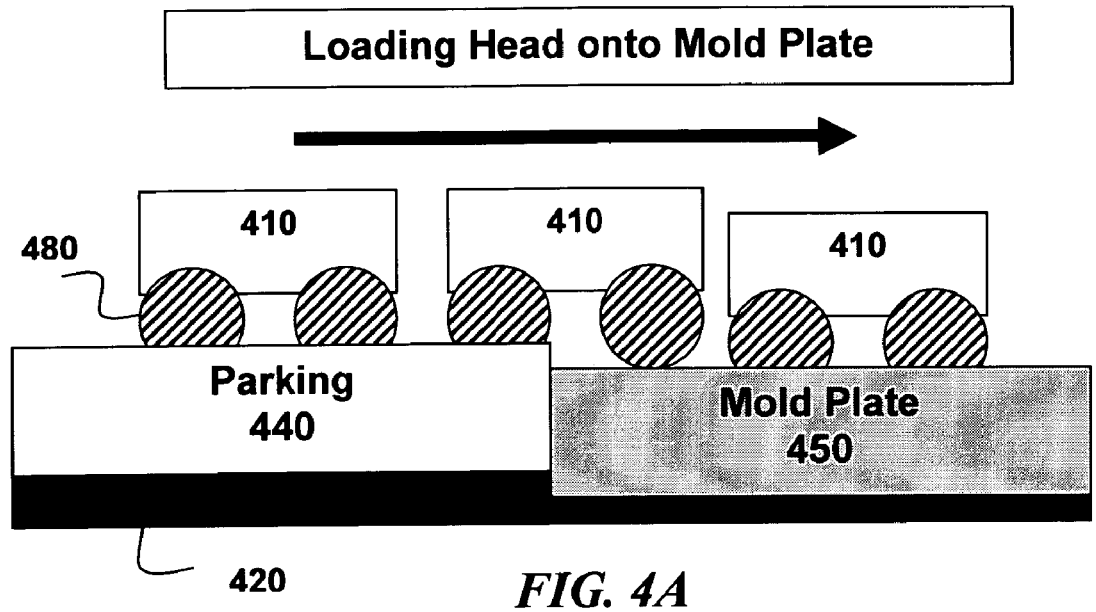
FIG. 4A is an illustration of the "Step Down" method according to an embodiment of the invention, showing the loading of a fill head onto a mold plate.

Referring to FIG. 4A, we show an interface 420 between the mold plate 450 and the parking space 440 constructed such that the fill head 410 "steps down" across the interface 420, substantially reducing the stress on the o-ring 480. Stepping down means that the o-ring 480 is never engaged by (moved into) a sharp edge or seam. This is in contrast to current methods where the fill head 410 slides onto and off of the mold plate, exposing the o-ring 480 to edges that degrade the o-ring 480 and generate debris.

When combined with a carrier the o-ring 480 moves in only one direction. This is desirable to cut down on o-ring 480 stress and degradation. As shown in FIG. 4A the fill head 410 is moving from left to right. As it leaves the parking platform 440, the o-ring 480 (shown in cross-section) is slightly reformed as it moves down to the mold plate 450. Note that the "step down" is only a slight level change.

Figure 4B:
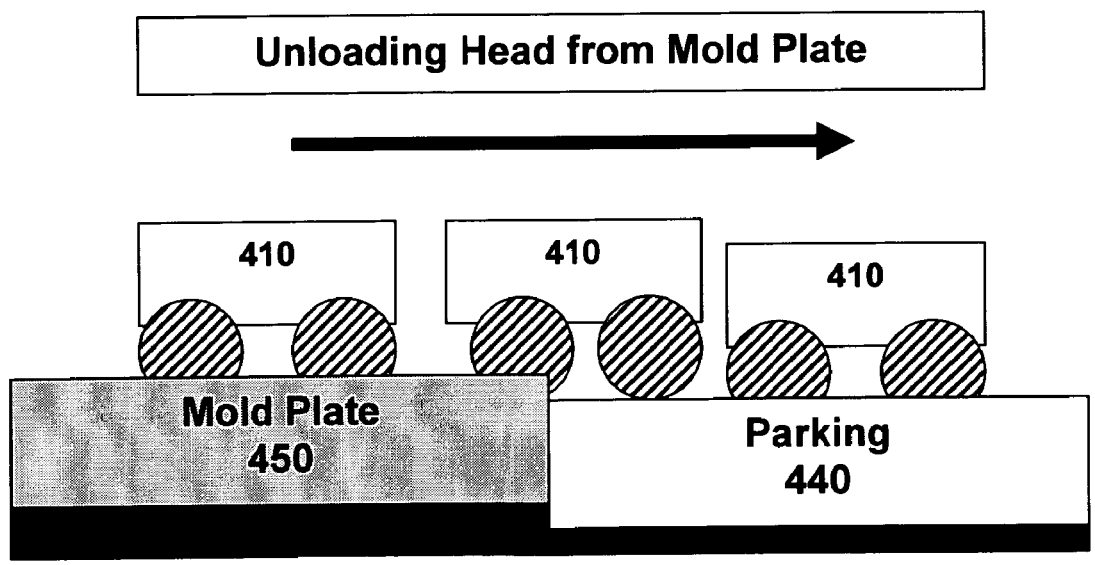
FIG. 4B is another illustration of the "Step Down" method according to an embodiment of the invention, showing the unloading of a fill head from a mold plate.

In FIG. 4B we see how the unloading of the fill head 410 from the mold plate 450 is accomplished, also with the "step-down." As the fill head 410 moves from the mold plate 450 onto the parking or transitional area 440 the o-ring 480 reforms slightly to make contact with the lower surface. Once on the lower surface, which in this case is the parking area 440 the o-ring 480 deforms slightly to continue to make contact with the surface. As the o-ring 480 moves across the surfaces it is constant contact with the surfaces and thus acts as a wiper, carrying off any excess solder or debris from the filling process. The debris could emanate from the actual o-ring 480 if it is damaged during the filling process. Reducing the stress and damage to the o-ring 480 also reduces the debris produced during the process.

In addition to enabling this "step down," using a mold plate carrier 420 allows for unidirectional movement of the fill process. As stated earlier, changing movement direction is stressful on the o-ring 480. In addition, using a mold plate carrier 420 allows for easy cleaning of the plates with less machine downtime. With the carrier implementation, the plates can be removed for cleaning while the next (or prior) plate is being filled and then reloaded back onto the platform. Fill head pressure can be lowered across the transition to reduce the possibility of leakage at the fill head ends.

In a preferred embodiment of the invention, the mold plate carrier 420 and parking area 440 are constructed of a plastic substance or other similar material softer than glass in order to avoid the problems associated with glass (such as chipping and breakage). Note that the softer than glass material may be just a coating on a harder material that makes up the body of the carrier 420 or the parking space 440. Whatever the material it must also stand up well to the high temperatures of the molten solder. Although the CTE of glass is ideal for this process, it is not recommended for a mold plate carrier 420 because it has the drawback of chipping and breakage, especially when a glass mold plate 450 comes into contact with a glass mold plate carrier 420. Mold plate edges are not perfectly smooth. The roughness of one edge can engage the roughness of another. If a plate then moves relative to a mold plate carrier 420 which is also made of glass the plate and/or carrier can "bind," creating stresses significant enough to chip, crack, or break one or both pieces of glass.

Figure 5:
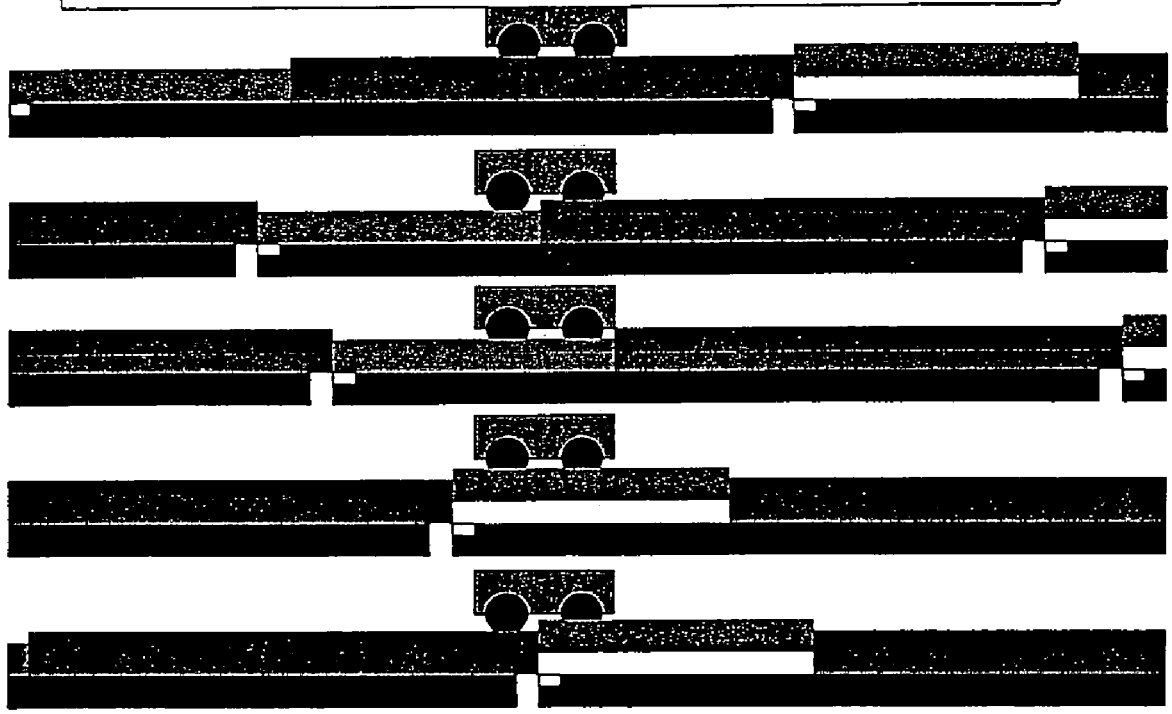
FIG. 5 is an illustration of the lifting of a parking plate in the "Step Down" method according to an embodiment of the invention.

FIG. 5 shows an embodiment of the invention illustrating how the fill head always "steps down" to the next platform to reduce stress on the o-ring 480. In this embodiment the parking plate 440 can be actively lifted through mechanical means or it can be lifted by interaction with guides. The plate 440 can have an actuator beneath it that lifts it (hydraulic, pneumatic, mechanical) or, in the case of a fixed head, it can have rollers or guide pins on the ends or underneath the plate that engage ramped guide structures which cause the plate's level to change as the plate moves across the guide structures.

Figure 6:
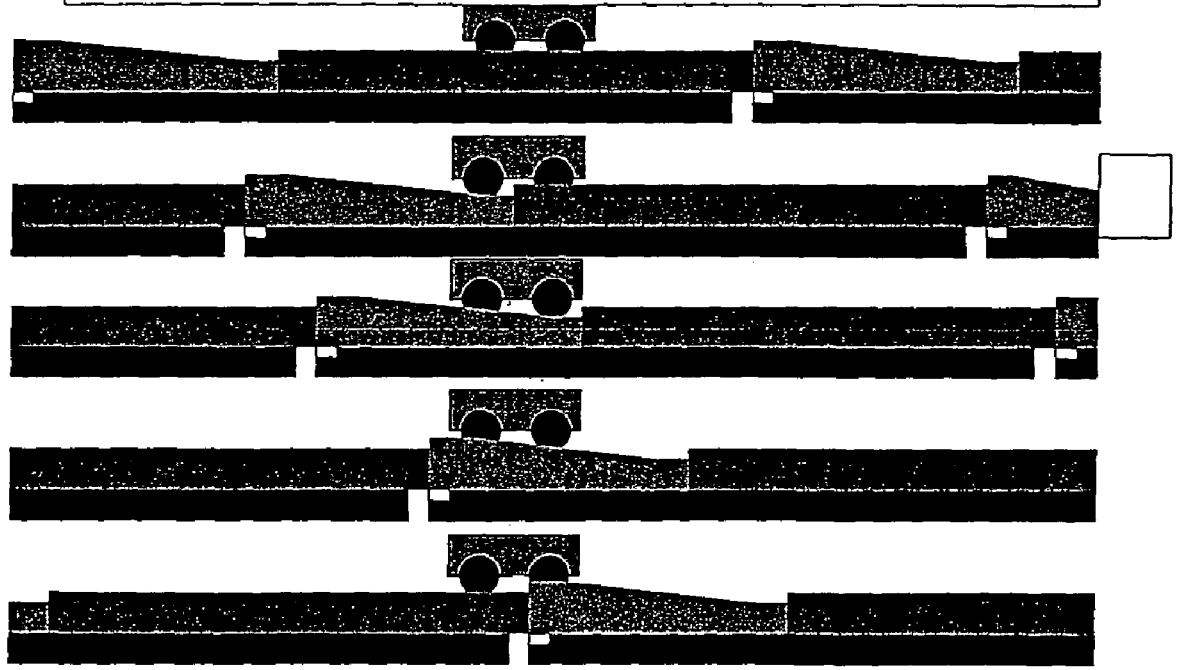
FIG. 6 is an illustration of another embodiment of the "Step Down" method showing a sloped parking plate.

Referring to FIG. 6 we discuss another embodiment of the invention where the parking plate 440 from FIG. 5 is sloped to allow for an even smoother transition from the parking plate 440 to the mold plate 450. Note that the slope is always in the same direction and it is quite a small slope, but just enough to provide a comfortable lift to the o-ring 480 so that it can be gently released onto the lower platform. The parking plate 440 can be constructed of a plastic material (or other similar material softer than glass) which can be easily formed and shaped.

Therefore, while there have been described what are presently considered to be the preferred embodiments, it will understood by those skilled in the art that other modifications can be made within the spirit of the invention.

I claim:

1. A mold plate to parking location interface comprising:
   a fill head with an o-ring, the fill head for dispensing solder bumps into cavities on the mold plate;
   a parking plate for locating the fill head while the fill head is not depositing solder on the mold plate; and a platform underneath a first plate and a second plate for relatively moving the fill head from the first plate to the second plate by stepping down such that the o-ring decompresses as it crosses from the first plate to the second plate;

wherein the first plate is either the mold plate or the parking plate; wherein the second plate is the other of said mold plate or parking plate wherein the fill head moves in only one direction;

wherein the stepping down comprises moving from a higher elevation to a lower elevation as the fill head relatively moves from the first plate to the second plate; and wherein the stepping down is enabled by moving the first plate relative to the second plate such that the first plate where the fill head is positioned is at a higher elevation than the second plate before relatively moving the fill head to the second plate.

2. The interface of claim 1 further comprising an actuator positioned beneath the platform for lifting and lowering the platform to move the first plate relative to the second plate such that the first plate where the fill head is positioned is at a higher elevation than the second plate before relatively moving the fill head to the second plate.

3. The interface of claim 1 wherein the platform further relatively moves the fill head from the second plate to a third plate.

4. The interface of claim 3 wherein the platform is constructed of a material having properties similar to plastic.

5. The interface of claim 3 wherein the platform lifts and lowers the second plate relative to the third plate.

6. The interface of claim 1 wherein the first plate is the mold plate and the second plate is the parking plate.

7. The interface of claim 1 wherein the first plate is the parking plate and the second plate is the mold plate.

* * * * *